United States Patent
Ginetti

(10) Patent No.: US 7,634,743 B1
(45) Date of Patent: Dec. 15, 2009

(54) METHOD FOR UPDATING A PLACED AND ROUTED NETLIST

(75) Inventor: Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 426 days.

(21) Appl. No.: 11/490,668

(22) Filed: Jul. 21, 2006

(51) Int. Cl.
*G06F 17/50* (2006.01)

(52) U.S. Cl. ............................................. 716/1; 716/11

(58) Field of Classification Search ...................... 716/1, 716/11
See application file for complete search history.

(56) References Cited

U.S. PATENT DOCUMENTS

| | | | | |
|---|---|---|---|---|
| 5,301,318 | A * | 4/1994 | Mittal | 716/11 |
| 5,623,420 | A * | 4/1997 | Yee et al. | 716/1 |
| 5,946,219 | A * | 8/1999 | Mason et al. | 716/16 |
| 6,102,964 | A * | 8/2000 | Tse et al. | 716/18 |
| 6,378,116 | B1 | 4/2002 | Ginetti | |
| 6,405,345 | B1 | 6/2002 | Ginetti | |
| 6,440,780 | B1 * | 8/2002 | Kimura et al. | 438/129 |
| 6,453,454 | B1 * | 9/2002 | Lee et al. | 716/11 |
| 6,519,743 | B1 | 2/2003 | Nauts et al. | |
| 7,111,269 | B2 * | 9/2006 | Satapathy et al. | 716/11 |
| 2003/0233625 | A1 * | 12/2003 | Brazell et al. | 716/8 |
| 2004/0098686 | A1 * | 5/2004 | Lackey | 716/6 |
| 2004/0199879 | A1 * | 10/2004 | Bradfield et al. | 716/1 |
| 2005/0097493 | A1 * | 5/2005 | Monthie et al. | 716/11 |
| 2006/0259880 | A1 * | 11/2006 | Dood et al. | 716/2 |

* cited by examiner

*Primary Examiner*—Jack Chiang
*Assistant Examiner*—Suchin Parihar
(74) *Attorney, Agent, or Firm*—Vista IP Law Group, LLP

(57) ABSTRACT

Method for updating a circuit design. A modification to a netlist that includes original components and original spare cells is received. Original components that are not required by the modification are identified, disconnected and marked or made new spare cells. A pool of spare cells is generated and includes original and new spare cells. The netlist is updated by adding new components, and added components are mapped to spare cells selected from the pool. If mapping does not satisfy a design constraint, such as a timing constraint, then original components can be de-mapped and made spare cells, added components are mapped to spare cells resulting from de-mapping, and de-mapped components can be re-mapped to other spare cells.

57 Claims, 13 Drawing Sheets

METHOD FOR UPDATING A PLACED AND ROUTED NETLIST

FIELD OF THE INVENTION

The present invention relates generally to electronic design automation and, more particularly, to automatically updating a placed and routed netlist.

BACKGROUND

Electronic Design Automation (EDA) is used to design and simulate electronic circuits. A functional chip architecture is developed and implemented in register transfer level (RTL) language by a system designer. The RTL is assigned to regions of a chip (e.g., by assignment of I/O pins), and the RTL is mapped into a combinational logic gate level netlist, e.g., a Verilog netlist. A netlist describes the connectivity of components of the circuit. More particularly, a netlist provides instances of components and nets. Instances are realized from a component library, e.g. a resistor, capacitor, and other circuit components. Nets are wires that connect the circuit components together. The circuit design typically includes spare cells, which are provided in the event that changes must be made to the circuit design at a later time. In an exemplary circuit design may have about 90-95% of the gates form the circuit design and about 5-10% of the gates are spare cells.

A technology mapper receives the net list, determines gates that are available from a component or gate library, and modifies and optimizes the netlist based on the components available from the library and design constraint considerations. Further details regarding exemplary technology mappers can be found in U.S. Pat. Nos. 6,378,116; 6,405,345 and 6,519,743, the contents of which are incorporated herein by reference.

A layout designer determines how to place and route the design that is provided by the system designer. Netlist gates are assigned to or placed on locations of the chip, and a router is used to connect gates in the netlist with wires. More particularly, a placer element takes a given netlist together with the parts library and determines the location of the components on a chip to produce a circuit layout, which can then be optimized to satisfy certain design constraints. A router generates wires that connect the placed components. The "placed and routed" design on silicon can then be verified to confirm that the circuit functions according to the design, and the final design is turned into a mask, which is used to fabricate the circuit.

The design process, however, can be complicated by Engineering Change Orders (ECOs) or modifications that require changes to the circuit design. The modification may be necessary to address a problem or provide additional functionality. Such modifications can be difficult to implement, particularly when design changes are made late in the design process. For example, a layout designer may have a placed and routed design that is partially manufactured so that front-end layers are already manufactured, but back-end layers (routing layers) are not yet manufactured. An ECO may require that some logical connectivity must be updated in the placed and routed netlist to fix a bug or to add additional functionality. An issue may also arise in the context of a placed and routed design that is completely manufactured, but there is a timing yield problem. Debugging may determine that the yield problem is caused by an instance being faster than expected and introducing a hold time violation, or an instance may be slower than expected and introduces setup time violations. These modifications can be difficult to address at these stages of the design process in view of the work and manufacturing that has already been completed. Often times, these changes must be made using spare cells.

Spare cells are free or available cells that can be used to implement design changes. However, there may only be a few spare cells, the location of the spare cells may not be satisfactory, and the placement options may be limited. For example, the spare cell may be located far away from another circuit component, thereby introducing timing delays, which can be particularly problematic if the change involves the critical or longest path in the circuit. These constraints can further complicate the manner in which design modifications are completed, particularly late in the process when the circuit or chip is partially or completely manufactured.

One known solution is to simply discard the partially or completely fabricated wafers, re-design the placed and routed netlist, generate new masks (front-end and back-end) and re-manufacture the circuit. This solution is not desirable given the substantial costs and time associated with substantial re-designs and discarded wafers. Another known solution is to have a designer alter manually placed and routed design. However, manual reworks can be very labor intensive, expensive, and prone to errors. Further, manual reworks can become very complicated with increasing numbers of gates and can require days, weeks or months to complete.

Further, assuming the ECO is implemented, the resulting design may not satisfy design constraints. For example, available spare cells may be located far away from the critical path so that timing issues are not resolved. Current systems do not adequately address these issues.

Accordingly, there exists a need in the art for a method that can automatically update a placed and routed design to overcome the shortcomings associated with known techniques. The method should effectively manage and allocate spare cells as needed and allow for automatically updates 20 circuit designs without the need to discard partially or completely manufactured circuit components. The method should also reduce or minimize the amount of manual work that is required to implement design changes. The method should be flexible and should respect design constraints, such as timing and yield. Embodiments of the invention fulfill these unmet needs.

SUMMARY

According to one embodiment, a method for updating a circuit design includes receiving a modification to a netlist that is placed and routed. The netlist includes original components and original spare cells. The method further includes identifying original components that are not required by the modification and generating a pool of spare cells that includes original spare cells and new spare cells. The identified components are made new spare cells.

According to another embodiment, a method for updating a circuit design includes receiving a modification to a netlist that is placed and routed and includes original components and original spare cells. The method further includes identifying original components that are not required by the modification and disconnecting the identified components. Disconnected components are marked as new spare cells. The method further includes generating a pool of spare cells that includes original spare cells and new spare cells. The netlist is updated by adding new components required by the modification, and the added components are mapped to spare cells selected from the pool.

Another alternative embodiment is directed to a method for updating a circuit design that includes receiving a modification to a place and routed netlist that includes original components and original spare cells and generating a pool of spare cells that includes the original spare cells. Original components that are not required by the modification are identified, disconnected and marked as new spare cells, which are added to the pool. The netlist is updated by adding new components required by the modification and mapping added components to spare cells selected from the pool. At least one new spare cell in the pool is used for mapping. A determination is made whether mapping satisfies a design constraint and if not, existing components are de-mapped and added components are mapped to spare cells resulting from de-mapping.

In various embodiments, mapping added components to spare cells selected from the pool can involve mapping to original spare cells and/or new spare cells. This can be performed automatically to address design constraints, timing, signal integrity, yield and design rules. Further, if mapping does not satisfy certain criteria, such as a design constraint, then existing components can be de-mapped, disconnected and marked as spare cells, and components that are to be added can be mapped to spare cells resulting from de-mapping.

BRIEF DESCRIPTION OF THE DRAWINGS

Referring now to the drawings, in which like reference numbers represent corresponding parts throughout, and in which.

DETAILED DESCRIPTION OF ILLUSTRATED EMBODIMENTS

Embodiments of the invention provide methods for automatically updating a placed and routed netlist. Components that are no longer needed as a result of modification are disconnected and marked as spare cells. The logical connectivity of the placed and routed netlist is automatically updated by recycling or re-using discarded components. Embodiments advantageously expand the number of spare cells that are available to implement design changes and also provide enhanced flexibility in the placement and routing of components to satisfy design constraints, such as timing, signal integrity, yield and design rules. Embodiments achieve these benefits by automatically performing these functions without requiring user input. Further, if a design change does not satisfy design constraints, embodiments advantageously allow original components to be de-mapped in or around critical areas to allow mapping of added component and to satisfy design constraints. Previously de-mapped components can be re-mapped to less critical or non-critical areas. Further aspects of embodiments of the invention and advantages thereof are described with reference to FIGS. 1-13.

Figure 1:
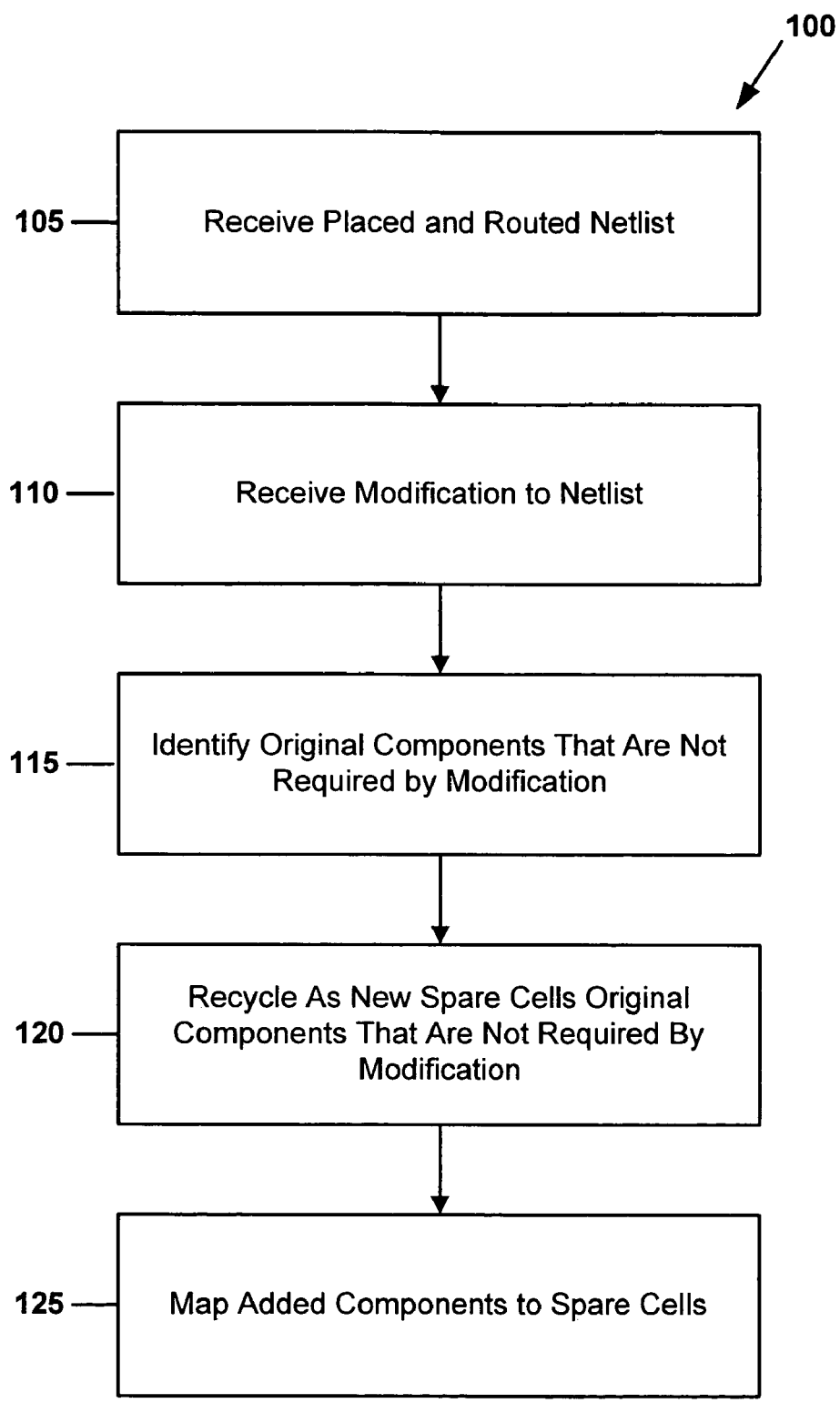
FIG. 1 is a flow chart of a method for updating a circuit design by recycling as spare cells components that are not required as a result of a modification to a circuit design according to one embodiment.

Referring to FIG. 1, one embodiment of the invention is a method 100 for generating a pool of spare cells for implementing circuit design modifications. In step 105, a placed and routed netlist is received, and a modification to the circuit design or netlist is received in step 110. The design modification can be, for example, a second netlist that includes changes relative to the netlist of the placed and routed design, e.g., a modification to a source Verilog netlist.

In step 115, original instances of components (generally, original "instances" or "components") of the netlist that are not required as a result of the modification are identified. For example, an original component may be a four input AND gate, but the modification removes this component or calls for a different component, e.g., a two input OR gate. Components that are not required by the modification are recycled as spare cells in step 120. New components that are added as a result of the modification are mapped to spare cells in step 125. Spare cells for mapping new components can be spare cells of the original circuit design, new spare cells that are generated by step 120, or a combination thereof.

Figure 2:
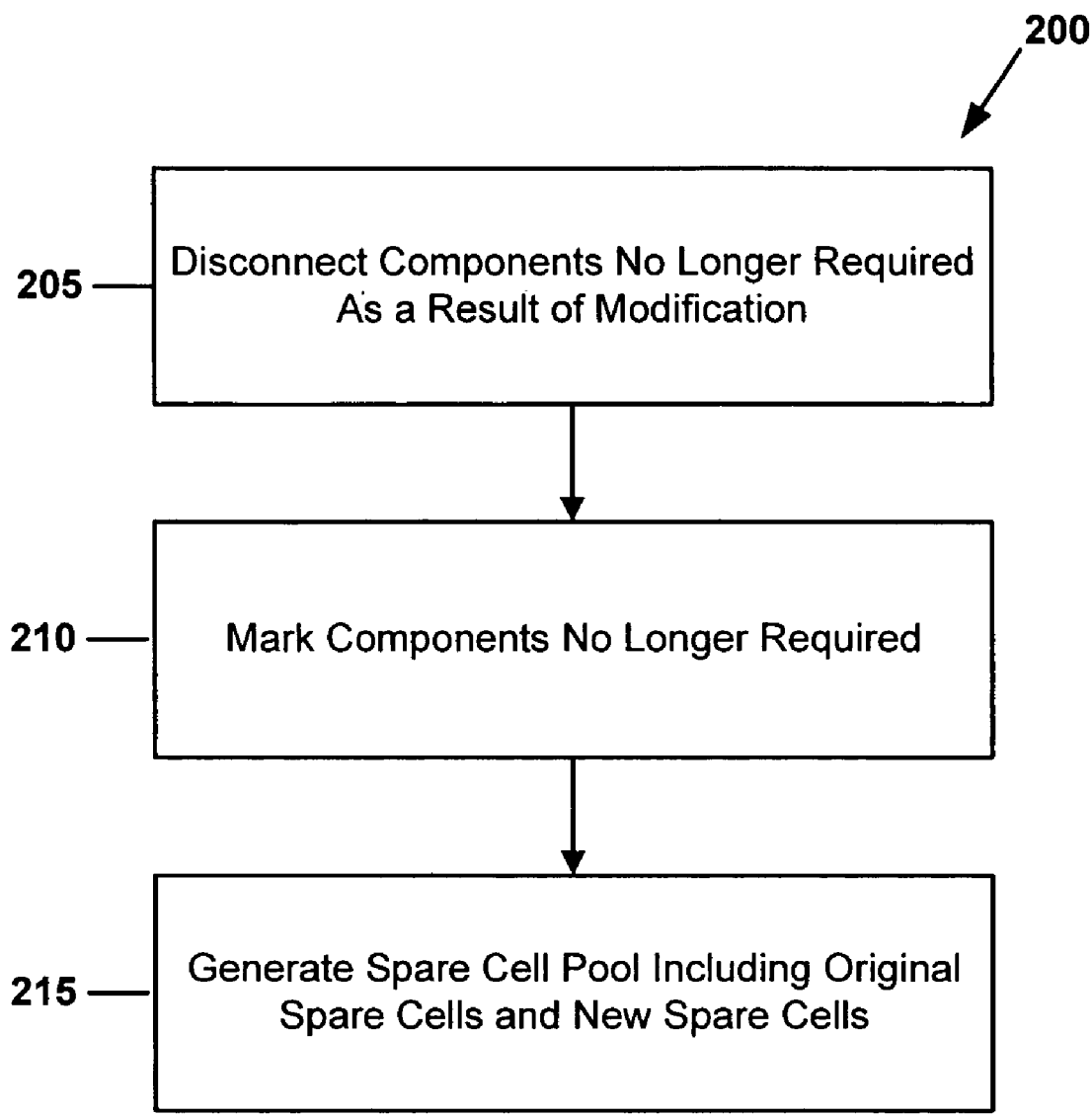
FIG. 2 is a flow chart further illustrating a method for updating a circuit design by recycling as spare cells components that are not required as a result of a modification to a circuit design according to one embodiment.

FIG. 2 further illustrates one manner of assigning or marking original components as spare cells. In step 205, identified instances or components that are no longer necessary as a result of the modification are disconnected. In step 210, the disconnected original components are marked, identified, assigned or made spare cells (generally, marking or making these components as spare cells). In step 215, these new spare cells are added to a pool of spare cells. The pool can include spare cells of the original circuit design and new spare cells marked or made as spare cells as a result of a design modification. Further details regarding original components, spare cells and a spare cell pool are described with reference to FIGS. 3-13.

Figure 3:
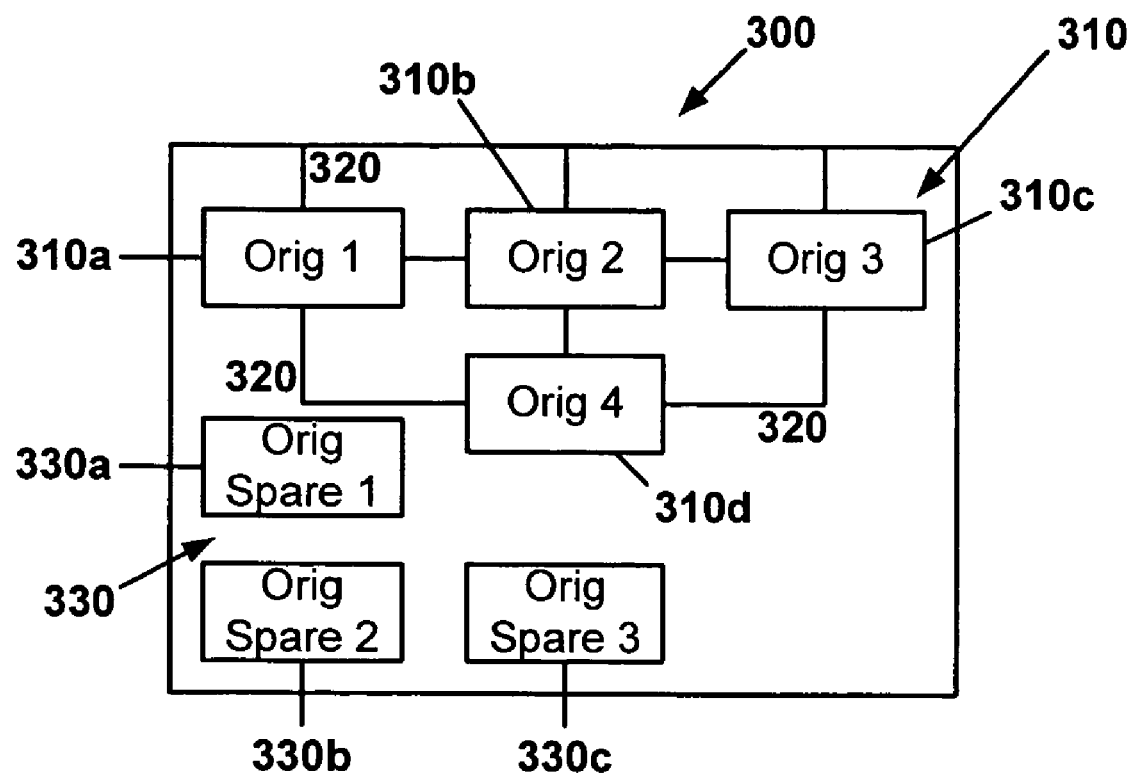
FIG. 3 is a block diagram illustrating a placed and routed netlist having original components and original spare cells.
Figure 4:
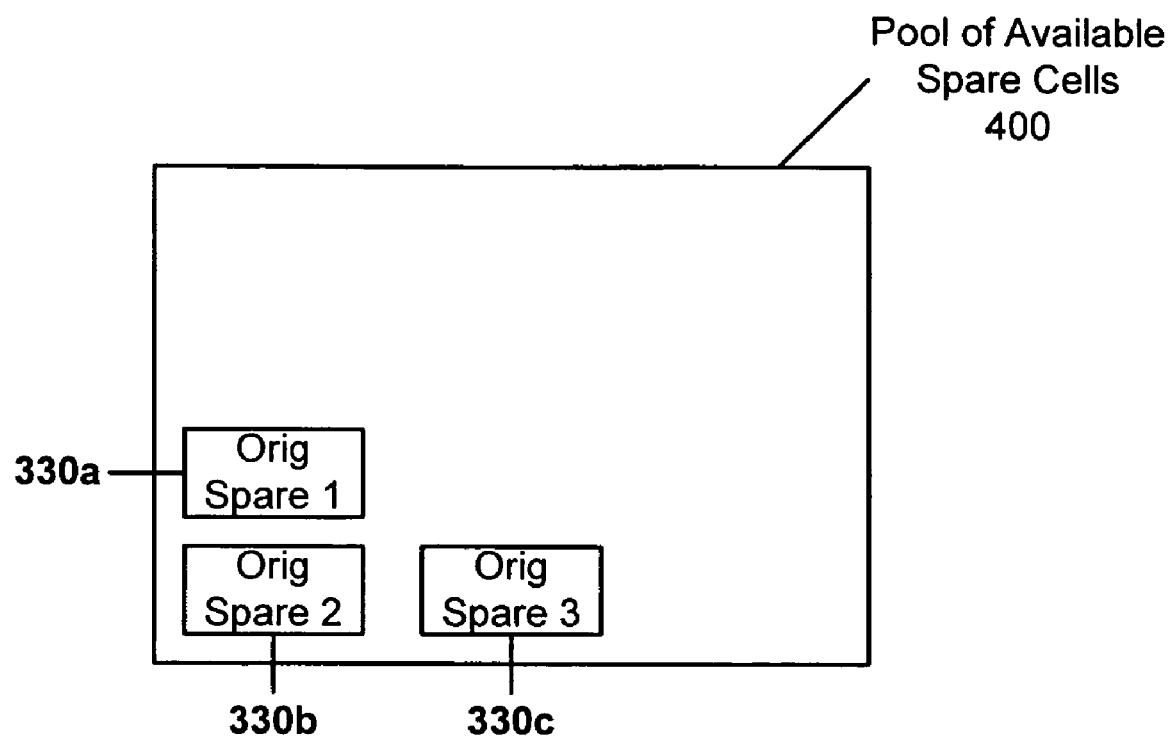
FIG. 4 illustrates a pool of spare cells that includes spare cells based on the original circuit design.

FIG. 3 generally illustrates components and connections of a simplified placed and routed circuit design 300 in block form. The placed and routed design 300 includes original instances or components 310a, 310b, 310c and 310d (generally, original components or instances 310), wires 320 connecting original components and/or other circuit elements, such as I/O pins, and original spare cells 330a, 330b and 330c (generally, original spare cell 330). A circuit design may include, our example, about 90-95% of the original components that are placed and routed, and about 5-10% of the components as original spare cells for use at later time if needed. Referring to FIG. 4, an initial pool 400 of spare cells includes the original spare cells 230. Persons skilled in the art will appreciate that circuit designs can have various numbers of components, and spare cells. Further, persons skilled in the art will appreciate that in practice, a netlist typically includes many more original components and original spare cells, and that the number, percentages, placement and routing of original components and spare cells shown in FIGS. 3 and 4 are provided for purposes of explanation and illustration, not limitation.

Figure 5:
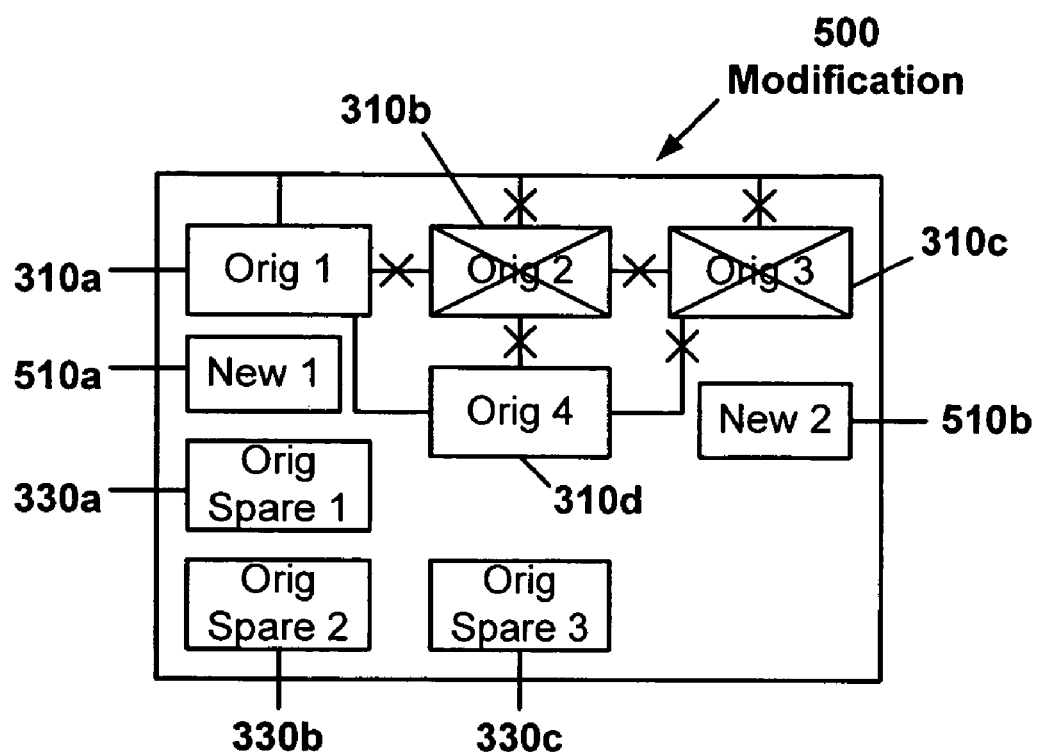
FIG. 5 is a block diagram illustrating a modification to the placed and routed netlist that removes original circuit components and adds new circuit components.

Referring to FIG. 5, a modification 500 to the original placed and routed design 300 may involve removing or de-activating components of the original circuit design 300, e.g., components 310b and 310c may no longer be required (indicated by "X"). Wires 330 connecting components 310b and 310c to other components can be disconnected (also indicated by "X"). The modification 500 may also involve adding new components, such as new components 510a and 510b (generally 510).

Figure 6:
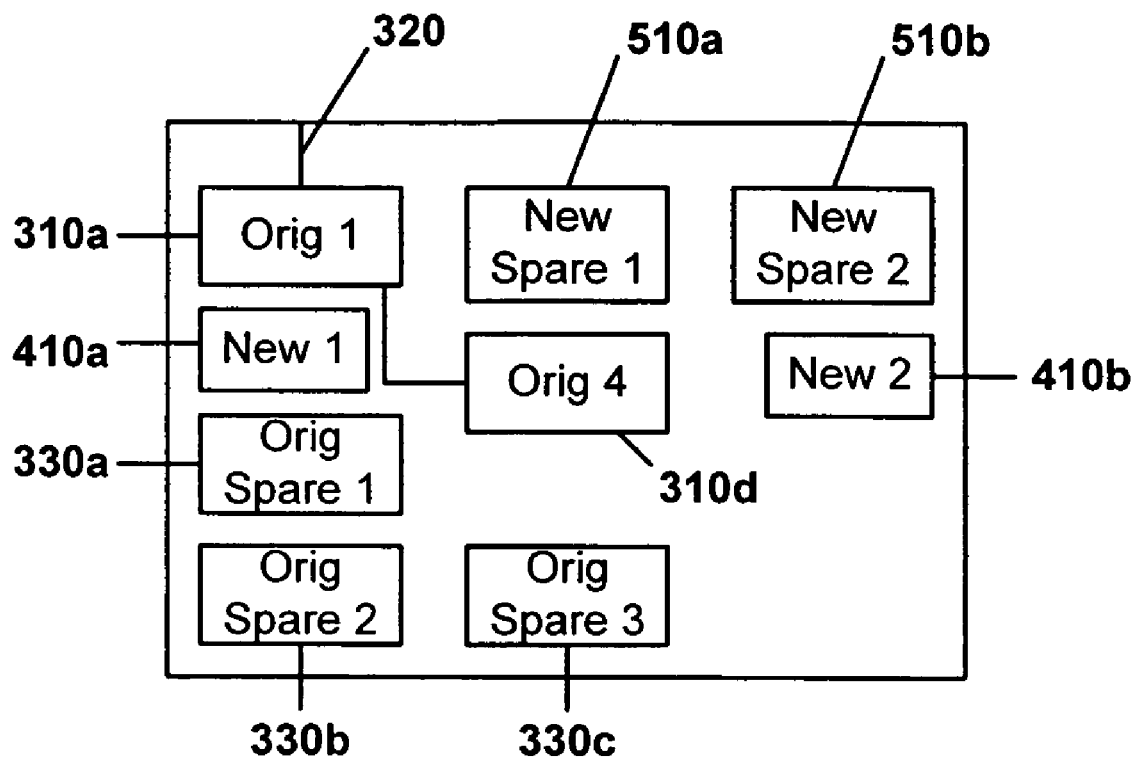
FIG. 6 is a block diagram illustrating how components that are no longer required as a result of a modification are recycled as spare cells according to one embodiment.
Figure 7:
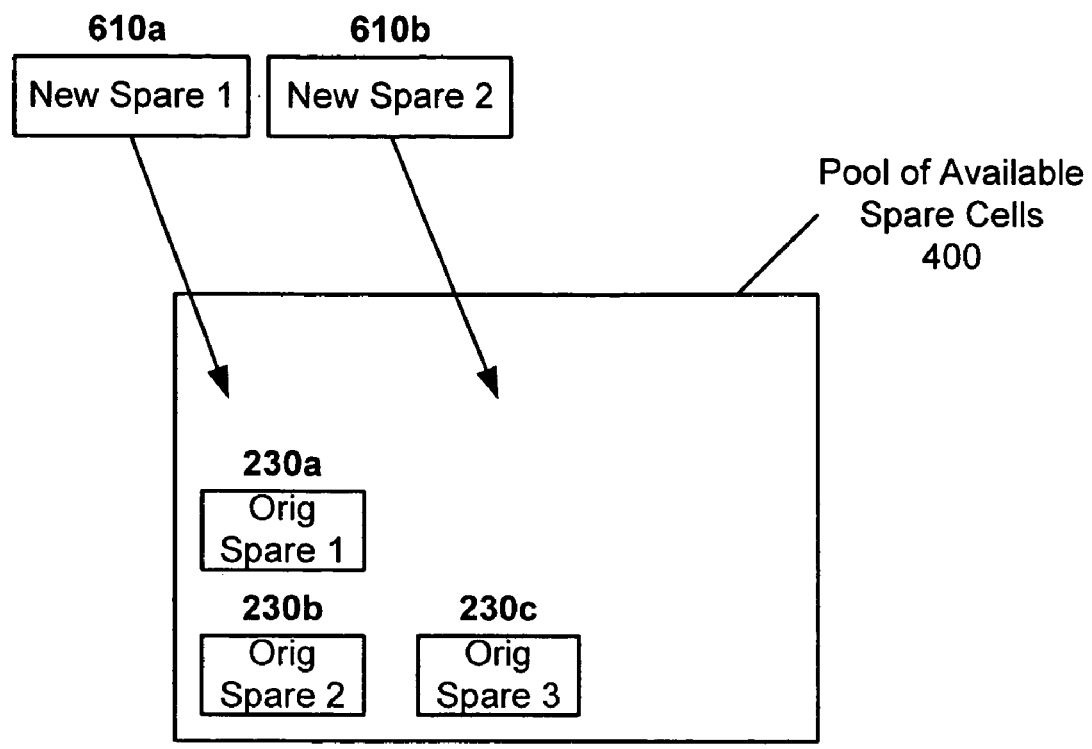
FIG. 7 illustrates a pool of spare cells that includes spare cells from the original design and spare cells resulting from the modification according to one embodiment.

Referring to FIG. 6, components 310b and 310c that are no longer required as a result of the modification 500 are assigned, marked, identified or made new or additional spare cells 610a and 610b (generally 610). Referring to FIG. 7, the new spare cells 610 are added to the spare cell pool 400, which includes original spare cells 310a-c and, in addition, the new spare cells 510a-b that were previously components of the original design 300, but that are not necessary due to the modification 500. The pool 400 can include different numbers and proportions of original spare cells 330 and new spare cells 510 that are added at different times as a result of different numbers of modifications 500 at various times. Thus, the number and proportion of original spare cells 330 and new spare cells 510 in the pool 400 can depend on, for example, the original circuit design 300, the stage at which the modification 500 is introduced, and the number type, and complexity of 4 of modifications 500.

Figure 8:
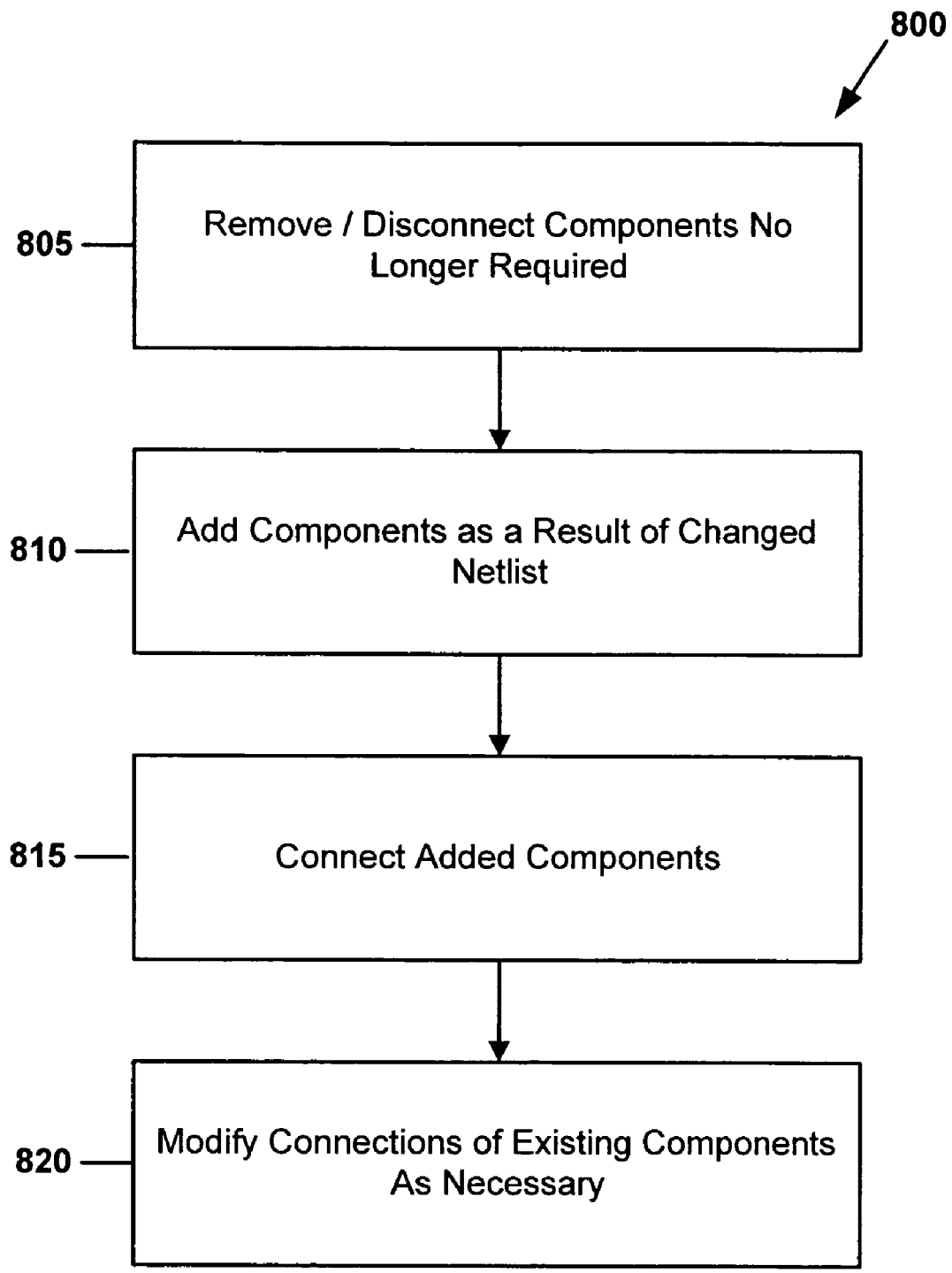
FIG. 8 is a flow chart illustrating updating an original netlist to reflect a circuit design modification.
Figure 9:
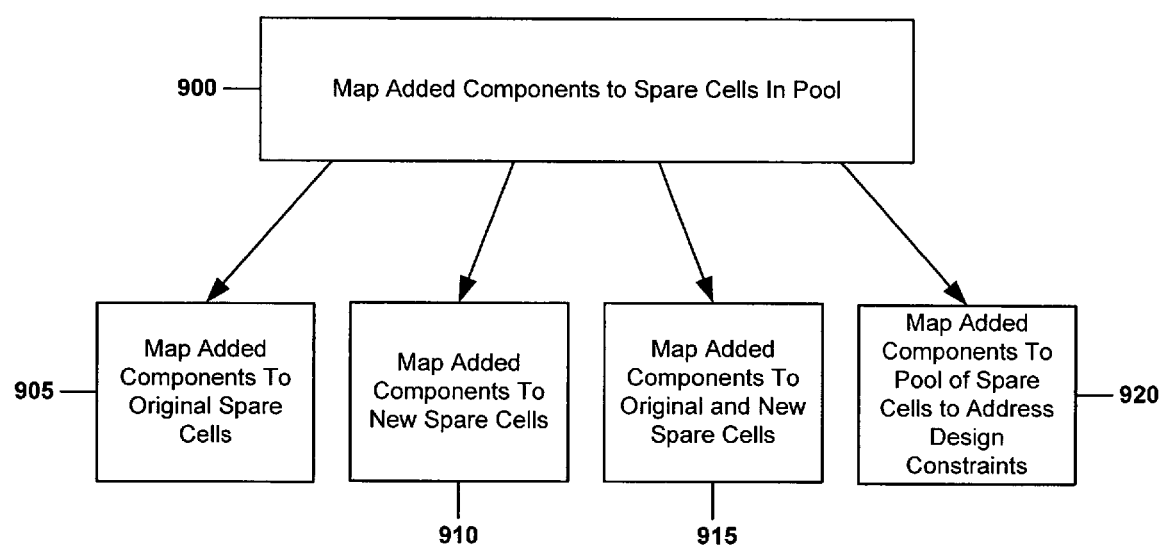
FIG. 9 illustrates mapping new instances of circuit components to spare cells according to one embodiment.
Figure 10:
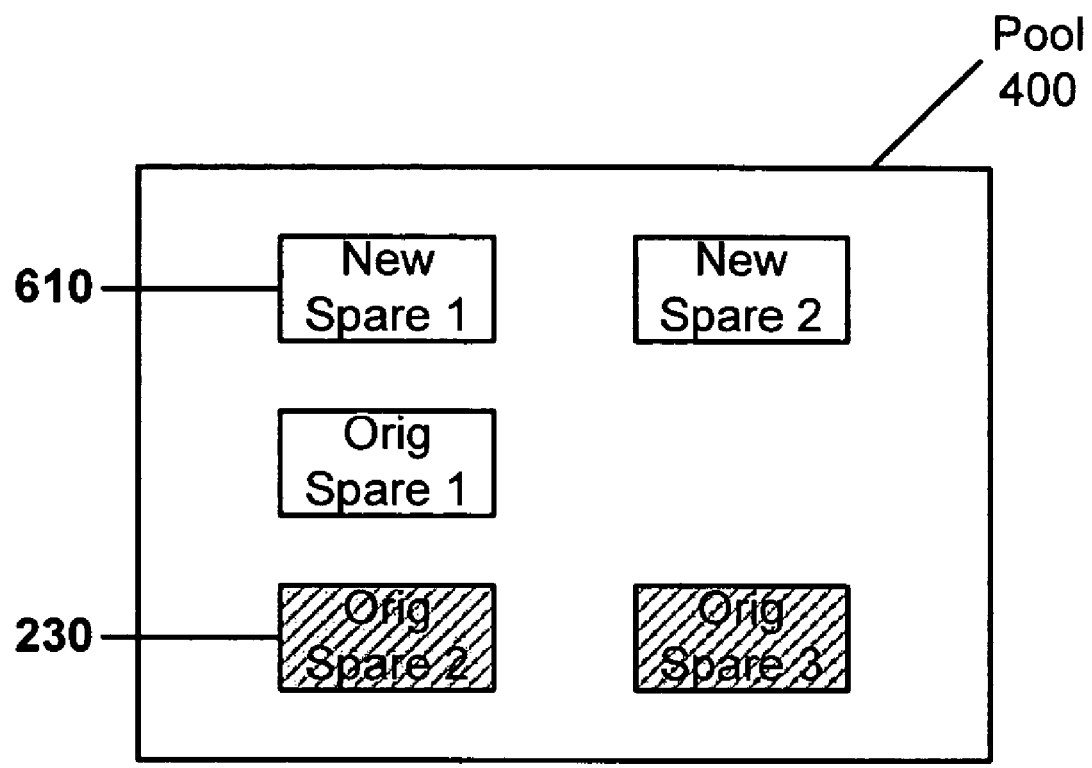
FIG. 10 illustrates mapping new instances of components to original spare cells in the pool according to one embodiment.
Figure 11:
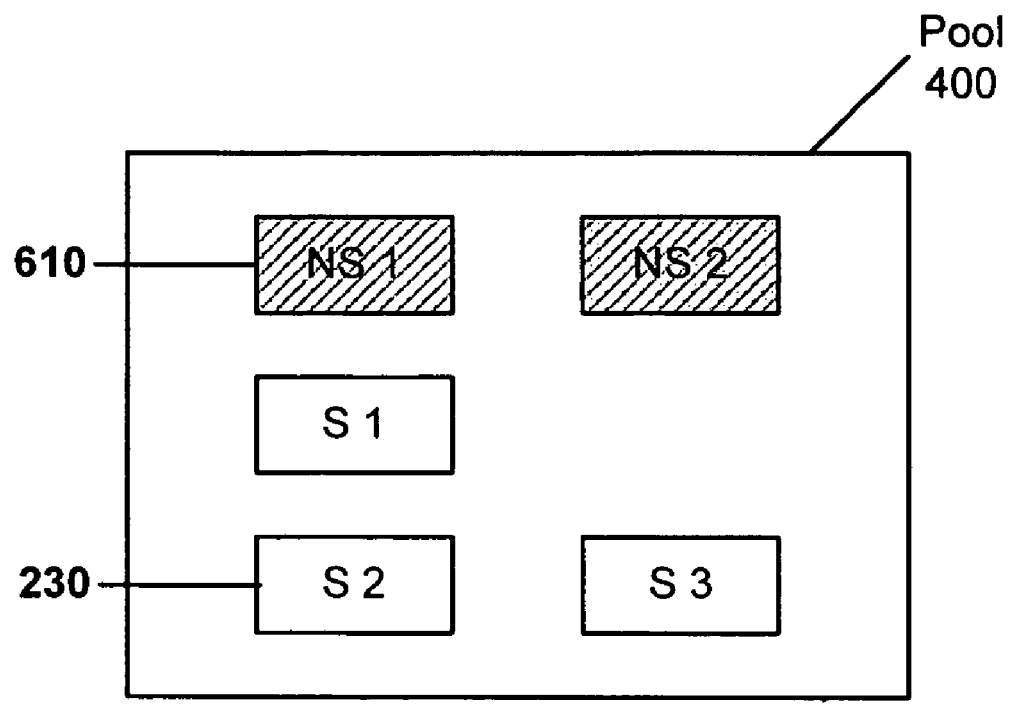
FIG. 11 illustrates mapping new instances of components to both original spare cells and new spare cells in the pool according to one embodiment.
Figure 12:
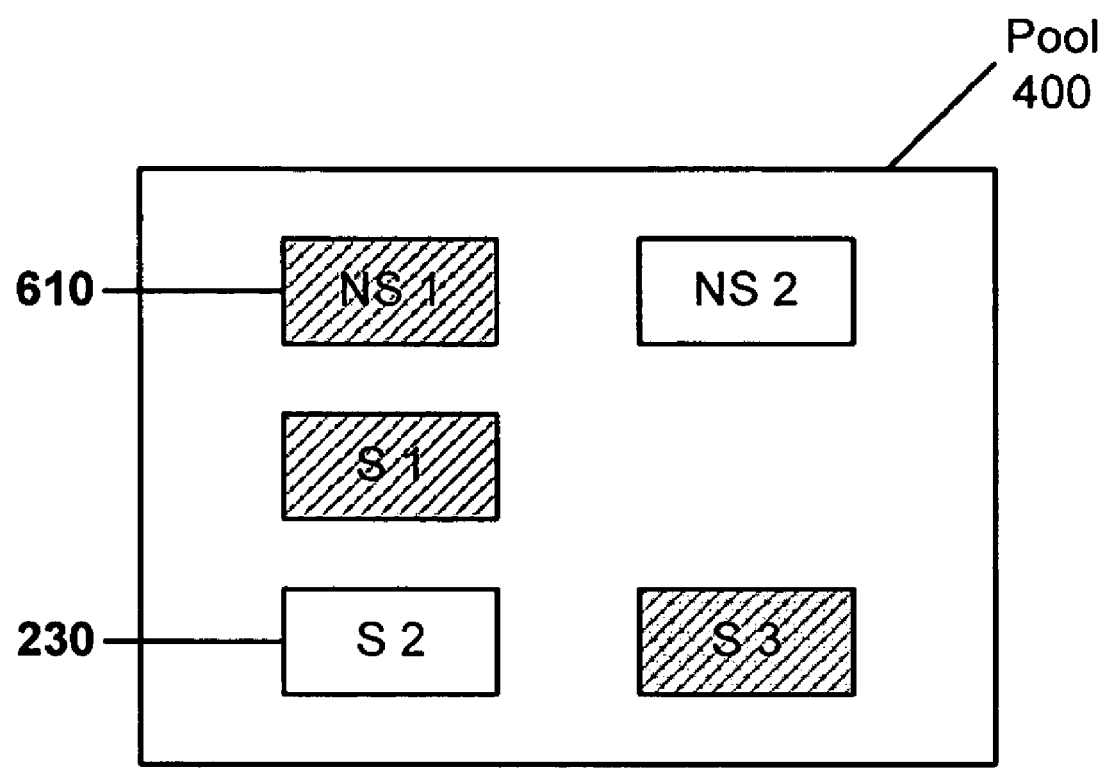
FIG. 12 illustrates mapping new instances of components to only new spare cells in the pool according to one embodiment.

Referring to FIG. 8, the original netlist can be updated 800 to reflect the component deletions and additions resulting from the modification. In step 805, the instances of components that are no longer required can be removed and/or disconnected. In step 810, new instances of components are added, and in step 815, the added instances of components are connected. If necessary, in step 820, connections of other components can be modified in order to incorporate the added components and connections.

Referring to FIGS. 9-12, embodiments of the invention can be implemented using a technology mapper that physically maps 900 added instances of components to spare cells that are selected from the pool 400. More particularly, a mapper receives the updated net list and determines which gates are available from a component or gate library. The mapper modifies and optimizes the updated netlist based on the library availability and for performance or design constraint considerations, as described in U.S. Pat. Nos. 6,378,116; 6,405,345 and 6,519,743, the contents of all of which were previously incorporated herein by reference. A new component can be mapped to only original spare cells 905, mapped only to new spare cells 910 and mapped to both original and new spare cells 915. Mapping can use spare cells to address various design constraints 920, such as timing, yield, etc. Embodiments of the invention enhance known technology mappers by re-using or recycling as spare cells components that are otherwise discarded, ignored or disconnected as a result of a modification 500, rather than using any spare cell that is available from a library.

Other embodiments of the invention provide for de-mapping portions of the original circuit 300 in order to accommodate certain design constraints when incorporating design changes. For example, there may be instances when spare cells selected from the pool do not enable the mapper to map logical instances of the added components while satisfying timing constraints since the spare cells that are utilized may be far away from an added component. This result could be of particular concern if the components are part of a critical path. In order to address this situation, alternative embodiments locally de-map portions of the original design 300, thus making these portions spare cells that are available to a mapper for mapping the added components resulting from the modification 500. This may be particularly useful if portions that are de-mapped are in or around critical parts of the design and can be moved to less critical or non-critical portions of the chip.

Figure 13:
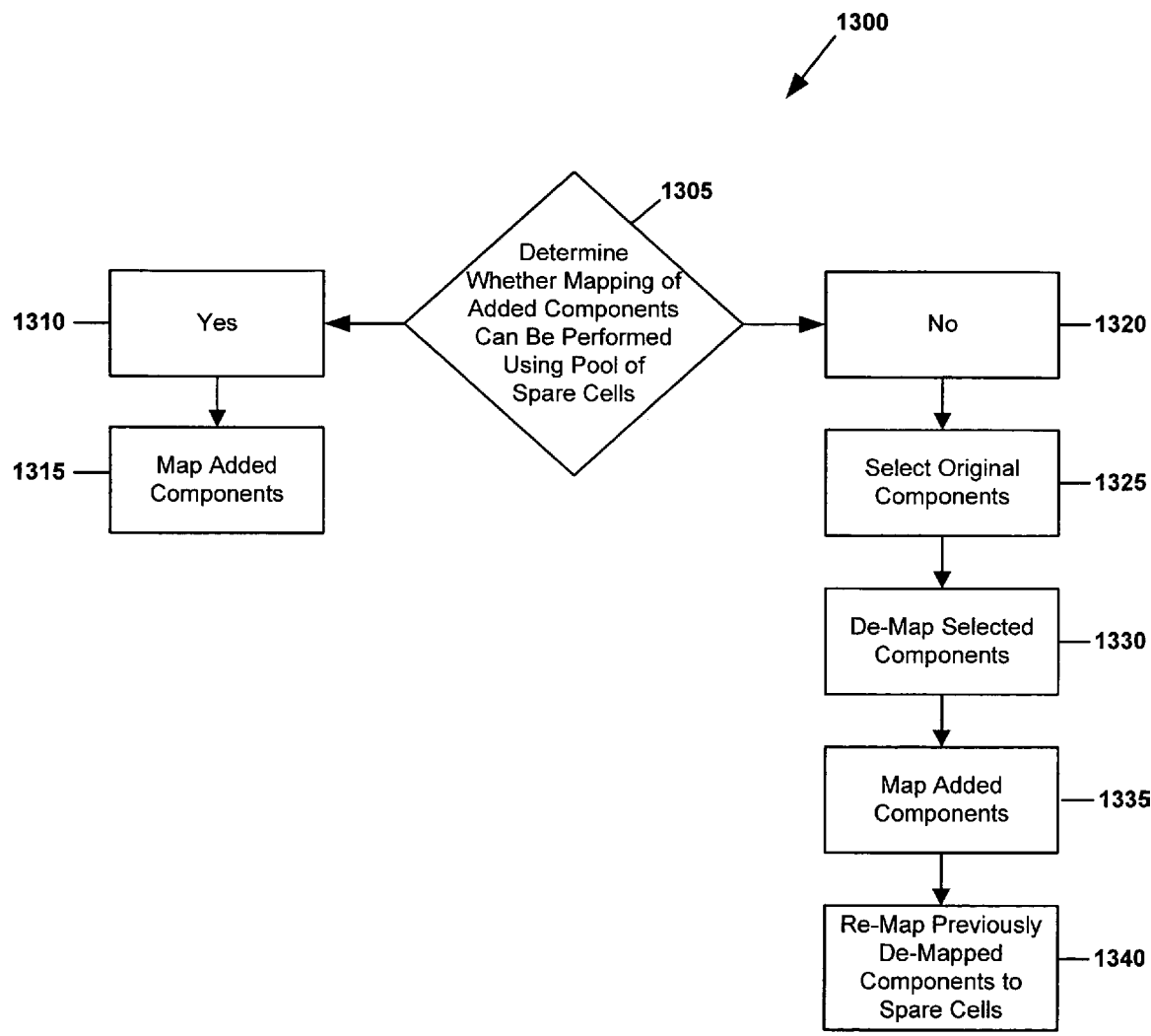
FIG. 13 is a flow chart illustrating a method for de-mapping original circuit components to optimize a design constraints when incorporating components required by a modification according to one embodiment.

More particularly, referring to FIG. 13, a method 1300 according to one embodiment includes step 1305 of determining whether mapping added instances of components can be performed using the pool of spare cells. In this example, the determination is based on whether the spare cells can satisfy timing constraints, but other design constraints can also be considered. In step 1310, if the determination is that the spare cells can be used and timing constraints are satisfied, then in step 1315, the added components are mapped using the selected spare cells. If it is determined in step 1320 that the spare cells cannot be used since the timing constraints would not be satisfied, then in step 1325, original components of the design are selected. In this example, the selected original components can be those original components that are in or around a critical path. In step 1330, the selected original components are de-mapped, and in step 1335, added components are mapped to cells that are available as a result of de-mapping, to spare cells of the pool, or a combination thereof, as necessary. In step 1340, the previously de-mapped spare cells can be re-mapped to spare cells that are available as a result of de-mapping (i.e., re-mapped to an original cell), to spare cells selected from the pool or a combination thereof, as necessary. This method can be repeated as necessary until the design changes are implemented and design constraints are satisfied.

One exemplary application of embodiments is improving the timing yield of a manufactured design. There may be hardware debugging techniques that enable extraction of on-silicon timing of a manufactured design as a Standard Delay Format (SDF) file. Static Timing Analysis (STA) can be run to extract the timing critical path, and a critical timing path optimizer can walk on the critical path to de-map part of it. The ECO physical technology mapper can be invoked to map components to spare cells and de-map portions of the original circuit design as necessary in order to provide proper placement of components to satisfy timing constraints.

Embodiments of the invention mapping methods that enhance mapping methods, such as those methods described in U.S. Pat. Nos. 6,378,116, 6,519,743 and 6,405,345. The following generally describes one exemplary manner in which embodiments can be implemented using a technology mapper to map new components or instances to new cells of a spare cell pool:

a. Decompose logic to re-map into AND/OR binary trees;
b. Distribute spare cells to the AND/OR binary trees;
c. Optionally de-map additional logic;
d. For each tree:
  i. For each node of the tree, starting from the leaf to the root:
    1. For spare cells within the proximity:
      a. If cell matches node (and its children):
        i. measure cost (area, timing, power, leakage, yield, ...)
        ii. Select gate based on cost considerations.

Thus, compared to known technology mappers, a mapper that applies embodiments of the invention distributes spare cells to AND/OR trees to prevent mapping of the first trees that may consume advantageous spare cells, thus preventing mapping of the last trees. The spare cell distribution to AND/OR binary trees in performed so that the binary tree has sufficient spare cells and those spare cells are in close proximity to the tree input/output. This distribution is based on available spare cells and the boolean function of the tree. Further, mappers can de-map logic to address cases where the location of spare cells may present timing issues, e.g., along a critical path. let d).

Embodiments of the invention provide significant advantages over prior techniques. For example, it is not necessary for designers to manually map new logic components to spare cells since embodiments can do this automatically, thus substantially reducing time, costs and manpower otherwise associates with manual reworks. Further, it is not necessary to discard wafers and base layer masks that have been manufactured. Rather, partially manufactured wafers can be re-used. Additionally, with embodiments, modifications can be implemented by only re-generating routing layers. These benefits can substantially reduce the time and costs that are required to implement modifications to circuit designs, while allowing more complicated modifications to be efficiently implemented, thereby improving the design process and the resulting circuit design.

Embodiments also advantageously automatically implement design modifications at various stages. For example, embodiments can be used to make modifications to placed and routed designs that are partially manufactured (e.g., with manufactured front-end layers) and completely manufactured. Further advantages of embodiments include manufacturing cost savings. With embodiments of the invention, the mapper does not require the manufacture of new front-end layer masks; rather, the mapper only requires the manufacture of a back-end layer mask (routing layer mask). With embodiments of the invention, the mapper does not require the manufacture of new front-end layer masks; rather, the mapper only requires the manufacture or modification of a back-end layer mask (routing layer mask), thereby resulting in reduced time and costs associated with implementing changes.

Embodiments have been described with reference to specific illustrates and descriptions thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

What is claimed is:

1. A method for updating a circuit design of an electronic circuit, comprising:
   receiving a modification to a netlist, wherein the netlist is placed and routed prior to receipt of the modification and includes original components and original spare cells;
   identifying one or more of the original components that are not required by the modification, wherein the act of identifying the one of the original components is performed by a processor; and
   generating or updating a pool of spare cells that includes the original spare cells and one or more new spare cells, wherein the one or more of the original components are made the one or more new spare cells respectively; and
   displaying the pool of spare cells on a display apparatus or storing the pool of spare cells in a computer readable storage medium or a storage device.

2. The method of claim 1, generating the pool of spare cells further comprising:
   disconnecting identified original components; and
   marking disconnected components as new spare cells.

3. The method of claim 1, further comprising:
   updating the netlist by adding new components required by the modification.

4. The method of claim 3, updating the netlist further comprising:
   modifying connections of original components to connect new components.

5. The method of claim 3, further comprising:
   mapping added components to spare cells selected from the pool.

6. The method of claim 5, wherein the step of mapping is performed automatically.

7. The method of claim 5, wherein added components are mapped only to new spare cells in the pool.

8. The method of claim 5, wherein added components are mapped to at least one new spare cell and at least one original spare cell in the pool.

9. The method of claim 5, wherein added components are mapped to new spare cells and original spare cells in the pool.

10. The method of claim 5, wherein added components are mapped only to original spare cells in the pool.

11. The method of claim 5, wherein mapping automatically addresses a design constraint.

12. The method of claim 11, wherein the design constraint is timing, signal integrity, yield or a design rule.

13. The method of claim 5, further comprising:
   determining whether mapping satisfies a design constraint.

14. The method of claim 13, wherein a determination is made that mapping does not satisfy the design constraint, further comprising:
   de-mapping existing components; and
   mapping added components to spare cells resulting from de-mapping.

15. The method of claim 14, further comprising:
   disconnecting de-mapped components; and
   marking the disconnected and de-mapped components as spare cells.

16. The method of claim 15, further comprising re-mapping previously de-mapped components.

17. The method of claim 15, wherein the design constraint is timing.

18. The method of claim 1, receiving the modification comprising
   receiving a second netlist.

19. The method of claim 1, receiving the modification comprising receiving a modification to a placed and routed design that is partially manufactured.

20. The method of claim 1, receiving the modification comprising
receiving a modification to a placed and routed circuit design that is completely manufactured.

21. The method of claim 1, wherein the steps of identifying and generating are performed automatically.

22. The method of claim 1 being performed by modifying a back-end layer mask, and without modifying a front-end layer mask.

23. A method for updating a circuit design, comprising:
receiving a modification to a netlist, wherein the netlist is placed and routed prior to receipt of the modification and includes original components and original spare cells;
identifying one or more of the original components that are not required by the modification;
disconnecting the one or more of the original components;
marking the or more of the original components as one or more respective new spare cells;
generating or updating a pool of spare cells that includes original spare cells and the one or more respective new spare cells;
updating the netlist by adding one or more new components which are required by the modification;
mapping the one or more new components to one or more spare cells selected from the pool, wherein the act of mapping is performed by a processor; and
displaying the pool of spare cells on a display apparatus or storing the pool of spare cells in a computer readable storage medium or a storage device.

24. The method of claim 23, updating the netlist further comprising:
modifying connections of original components to connect new components.

25. The method of claim 23, wherein identifying, disconnecting, marking, generating, updating and mapping are performed automatically.

26. The method of claim 23, wherein added components are mapped only to new spare cells in the pool.

27. The method of claim 23, wherein added components are mapped to at least one new spare cell and at least one original spare cell in the pool.

28. The method of claim 23, wherein added components are mapped to new spare cells and original spare cells in the pool.

29. The method of claim 23, wherein added components are mapped only to original spare cells in the pool.

30. The method of claim 23, wherein mapping automatically addresses a design constraint.

31. The method of claim 30, wherein the design constraint is timing, signal integrity, yield or a design rule.

32. The method of claim 23, further comprising:
determining whether mapping satisfies a design constraint.

33. The method of claim 32, wherein a determination is made that mapping does not satisfy the design constraint, further comprising:
de-mapping existing components; and
mapping added components to spare cells resulting from de-mapping.

34. The method of claim 33, further comprising:
disconnecting de-mapped components; and
marking the disconnected and de-mapped components as spare cells.

35. The method of claim 33, further comprising re-mapping previously de-mapped components.

36. The method of claim 32, wherein the design constraint is timing.

37. The method of claim 23, receiving the modification comprising
receiving a second netlist.

38. The method of claim 23, receiving the modification comprising
receiving a modification to a placed and routed design that is partially manufactured.

39. The method of claim 23, receiving the modification comprising:
receiving a modification to a placed and routed circuit design that is completely manufactured.

40. The method of claim 23, wherein the steps of identifying, disconnecting, marking, generating, updating and mapping are performed automatically.

41. The method of claim 23 being performed by modifying a back-end layer mask, and without modifying a front-end layer mask.

42. A method for updating a circuit design, comprising:
receiving a modification to a netlist, wherein the netlist is placed and routed prior to receipt of the modification to the netlist and includes original components and original spare cells;
generating or updating a pool of spare cells, the pool including the original spare cells;
identifying one or more of the original components that are not required by the modification;
disconnecting the one or more of the original components;
marking the one or more of the original components as one or more respective new spare cells;
adding the one or more respective new spare cells to the pool;
updating the netlist by adding one or more new components which are required by the modification;
mapping the one or more new components to one or more spare cells selected from the pool, wherein at least one new spare cell in the pool is used for mapping, and the act of mapping is performed by a processor;
determining whether a result of the act of mapping the one or more new components satisfies a design constraint;
if mapping does not satisfy the design constraint,
de-mapping one or more existing components, and
mapping the one or more new components to spare cells resulting from de-mapping; and
displaying the pool of spare cells on a display apparatus or storing the pool of spare cells in a computer readable storage medium or a storage device.

43. The method of claim 42, wherein added components are mapped only to new spare cells in the pool.

44. The method of claim 42, wherein added components are mapped to new spare cells and original spare cells in the pool.

45. The method of claim 42, wherein the design constraint is timing, signal integrity, yield or a design rule.

46. The method of claim 42, wherein spare cells for re-mapping previously de-mapped components are selected from the pool.

47. The method of claim 42, wherein the steps of identifying, disconnecting, marking, generating, updating, mapping, determining, de-mapping and mapping are performed automatically.

48. The method of claim 42 being performed by modifying a back-end layer mask, and without modifying a front-end layer mask.

49. A method for updating a circuit design, comprising:
receiving a modification to a netlist that is placed and routed prior to receipt of the modification to the netlist, the netlist including original components and original spare cells;
recycling, as new spare cells, one or more of the original components that are not required by the modification by adding the one or more of the original components as one or more new spare cells to a pool that includes the original spare cells and the one or more new spare cells;
mapping components added by the modification to spare cells selected from the pool, wherein the act of mapping is performed by a processor; and
displaying the pool on a display apparatus or storing the pool in a computer readable storage device or a storage device.

50. The method of claim 49, wherein added components are mapped only to new spare cells in the pool.

51. The method of claim 49, wherein added components are mapped to new spare cells and original spare cells in the pool.

52. The method of claim 49, wherein the steps of recycling and mapping are performed automatically.

53. The method of claim 49, being performed by modifying a back-end layer mask, and without modifying a front-end layer mask.

54. A computer program product comprising a computer readable storage medium having a sequence of instructions which, when executed by a processor, causes the processor to perform a process for updating a circuit design of an electronic circuit, the process comprising:
receiving a modification to a netlist, wherein the netlist is placed and routed prior to receipt of the modification and includes original components and original spare cells;
identifying one or more of the original components that are not required by the modification, wherein the act of identifying the one of the original components is performed by a processor; and
generating or updating a pool of spare cells that includes the original spare cells and one or more new spare cells, wherein the one or more of the original components are made the one or more new spare cells respectively; and
displaying the pool of spare cells on a display apparatus or storing the pool of spare cells in a computer readable storage medium or a storage device.

55. A computer program product comprising a computer readable storage medium having a sequence of instructions which, when executed by a processor, causes the processor to perform a process for updating a circuit design of an electronic circuit, the process comprising:
receiving a modification to a netlist, wherein the netlist is placed and routed prior to receipt of the modification and includes original components and original spare cells;
identifying one or more of the original components that are not required by the modification;
disconnecting the one or more of the original components;
marking the one or more of the original components as one or more respective new spare cells;
generating or updating a pool of spare cells that includes original spare cells and the one or more respective new spare cells;
updating the netlist by adding one or more new components which are required by the modification;
mapping the one or more new components to one or more spare cells selected from the pool, wherein the act of mapping is performed by a processor; and
displaying the pool of spare cells on a display apparatus or storing the pool of spare cells in a computer readable storage medium or a storage device.

56. A system for updating a circuit design of an electronic circuit, comprising:
means for receiving a modification to a netlist, wherein the netlist is placed and routed prior to receipt of the modification and includes original components and original spare cells;
means for identifying one or more of the original components that are not required by the modification, wherein the means for identifying the one of the original components comprises a processor; and
means for generating or updating a pool of spare cells that includes the original spare cells and one or more new spare cells, wherein the one or more of the original components are made the one or more new spare cells respectively; and
a display apparatus configured for displaying the pool of spare cells or a computer readable storage medium or a storage device configured for storing the pool of spare cells.

57. A system for updating a circuit design of an electronic circuit, comprising:
means for receiving a modification to a netlist, wherein the netlist is placed and routed prior to receipt of the modification and includes original components and original spare cells;
means for identifying one or more of the original components that are not required by the modification;
means for disconnecting the one or more of the original components;
means for marking the one or more of the original components as one or more respective new spare cells;
means for generating or updating a pool of spare cells that includes original spare cells and the one or more respective new spare cells;
means for updating the netlist by adding one or more new components which are required by the modification;
means for mapping the one or more new components to one or more spare cells selected from the pool, wherein the means for mapping comprises a processor; and
a display apparatus configured for displaying the pool of spare cells or a computer readable storage medium or a storage device configured for storing the pool of spare cells.

* * * * *

UNITED STATES PATENT AND TRADEMARK OFFICE
CERTIFICATE OF CORRECTION

PATENT NO. : 7,634,743 B1  Page 1 of 1
APPLICATION NO. : 11/490668
DATED : December 15, 2009
INVENTOR(S) : Arnold Ginetti It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 573 days.

Signed and Sealed this

Ninth Day of November, 2010

David J. Kappos
*Director of the United States Patent and Trademark Office*